United States Patent
Snoeij et al.

(10) Patent No.: US 10,459,040 B2
(45) Date of Patent: Oct. 29, 2019

(54) INTEGRATED FLUXGATE MAGNETIC GRADIENT SENSOR

(71) Applicant: TEXAS INSTRUMENTS INCORPORATED, Dallas, TX (US)

(72) Inventors: Martijn Fridus Snoeij, Erding (DE); Viola Schäffer, Freising (DE); Gebhard Haug, Moessingen (DE)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 41 days.

(21) Appl. No.: 15/162,776

(22) Filed: May 24, 2016

(65) Prior Publication Data

US 2016/0349334 A1 Dec. 1, 2016

Related U.S. Application Data

(60) Provisional application No. 62/166,798, filed on May 27, 2015.

(51) Int. Cl.
*G01R 33/022* (2006.01)
*G01R 33/04* (2006.01)

(52) U.S. Cl.
CPC .......... *G01R 33/022* (2013.01); *G01R 33/04* (2013.01)

(58) Field of Classification Search
CPC .............. G01R 33/022; G01R 33/04
See application file for complete search history.

(56) References Cited

U.S. PATENT DOCUMENTS

| | | | | |
|---|---|---|---|---|
| 6,433,545 | B1* | 8/2002 | Kunze | G01R 33/09 324/207.21 |
| 7,555,398 | B2* | 6/2009 | Fowler | G01C 17/00 702/104 |
| 2007/0257669 | A1* | 11/2007 | Delevoye | G01R 33/04 324/253 |
| 2013/0125669 | A1* | 5/2013 | Barraco | G01L 3/102 73/862.333 |
| 2014/0009146 | A1* | 1/2014 | Blagojevic | G01R 33/04 324/252 |
| 2014/0285189 | A1* | 9/2014 | Kashmiri | G01R 33/04 324/253 |

* cited by examiner

*Primary Examiner* — Akm Zakaria
(74) *Attorney, Agent, or Firm* — John R. Pessetto; Charles A. Brill; Frank D. Cimino

(57) ABSTRACT

An integrated fluxgate magnetic gradient sensor includes a common mode sensitive fluxgate magnetometer and a differential mode sensitive fluxgate magnetometer. The common mode sensitive fluxgate magnetometer includes a first core adjacent to a second core. The first and second cores are wrapped by a first excitation wire coil configured to receive an excitation current that affects a differential mode magnetic field. The differential mode sensitive fluxgate magnetometer includes a third core adjacent to the first core and a fourth core adjacent to the second core. The third and fourth cores are wrapped by a second excitation wire coil configured to receive an excitation current that affects a common mode magnetic field.

8 Claims, 3 Drawing Sheets

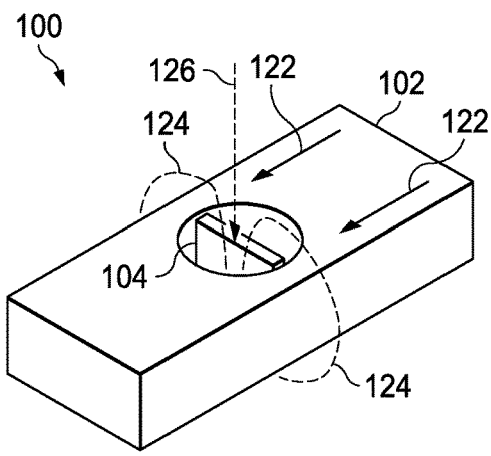
FIG. 1
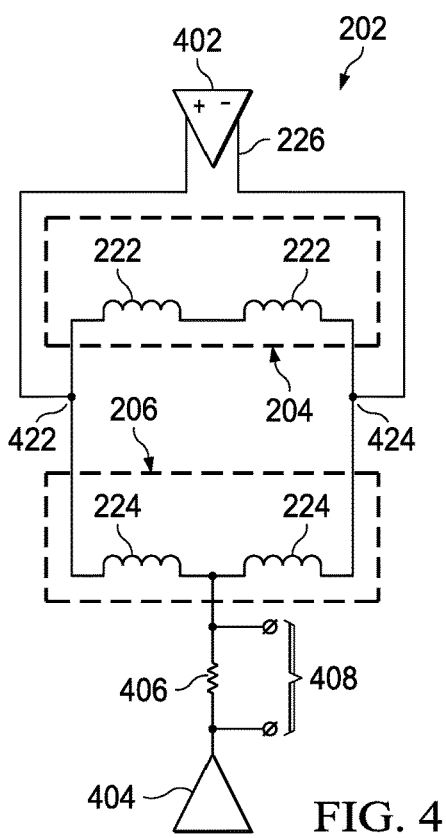
FIG. 4
FIG. 2

INTEGRATED FLUXGATE MAGNETIC GRADIENT SENSOR

CROSS-REFERENCE TO RELATED APPLICATIONS

The present application claims priority to U.S. Provisional Patent Application No. 62/166,798, filed May 27, 2015, titled "Integrated Fluxgate Magnetic Gradient Sensor," which is hereby incorporated herein by reference in its entirety.

BACKGROUND

Magnetic field measurement may be utilized in a variety of systems. For example, as current flows through a metallic material, a magnetic field is generated. Thus, the measurement of the magnetic field created indicates the amount of current through the metallic material. However, in addition to the magnetic field generated by the current, background magnetic fields (e.g., the magnetic field created by Earth) may also be present. In order to account for background magnetic fields, the measurement of a magnetic field gradient (i.e., the difference in magnetic field density at one location and another location) is utilized in many applications. For example, a magnetic field gradient may be utilized to measure industrial currents (e.g., currents through bus bars). Conventional systems use two magnetic sensors, such as fluxgate sensors, to measure the magnetic field gradient of a magnetic field.

SUMMARY

The problems noted above are solved in large part by systems and methods for measuring a magnetic field gradient. In some embodiments, an integrated fluxgate magnetic gradient sensor includes a common mode sensitive fluxgate magnetometer and a differential mode sensitive fluxgate magnetometer. The common mode sensitive fluxgate magnetometer includes a first core adjacent to a second core. The first and second cores are wrapped by a first excitation wire coil configured to receive an excitation current that affects a differential mode magnetic field. The differential mode sensitive fluxgate magnetometer includes a third core adjacent to the first core and a fourth core adjacent to the second core. The third and fourth cores are wrapped by a second excitation wire coil configured to receive an excitation current that affects a common mode magnetic field.

Another illustrative embodiment is a driver circuit that includes a differential voltage driver and a single-ended voltage driver. The differential voltage driver is configured to drive a differential voltage through a common mode sensitive fluxgate magnetometer and a differential mode sensitive fluxgate magnetometer. The single-ended voltage driver is configured to drive a single-ended voltage through the differential mode sensitive fluxgate magnetometer. An input to the differential voltage driver is a voltage across a common mode sense wire coil which is included in the common mode sensitive fluxgate magnetometer. An input to the single-ended voltage driver is a voltage across a differential mode sense wire coil which is included in the differential mode sensitive fluxgate magnetometer.

Yet another illustrative embodiment is a method for measuring a magnetic field gradient. The method includes driving, by a differential voltage driver, a differential voltage through a common mode compensation wire coil wrapped around a first core and a second core. The method also includes driving the differential voltage through a differential mode compensation wire coil wrapped around a third core and a fourth core. The method also includes driving, by a single-ended voltage driver, a single-ended voltage through the differential mode compensation wire coil. The method also includes sensing a magnetic field gradient voltage across a shunt resistor that is coupled to the single-ended voltage driver and the differential mode compensation wire coil.

BRIEF DESCRIPTION OF THE DRAWINGS

For a detailed description of various examples, reference will now be made to the accompanying drawings in which:

FIG. 1 shows an illustrative block diagram of a current measurement system utilizing an integrated fluxgate magnetic gradient sensor in accordance with various embodiments;

FIG. 2 shows an illustrative block diagram of an integrated fluxgate magnetic gradient sensor in accordance with various embodiments;

FIG. 4 shows an illustrative block diagram of a driver circuit included in an integrated fluxgate magnetic gradient sensor in accordance with various embodiments.

NOTATION AND NOMENCLATURE

Figure 3:
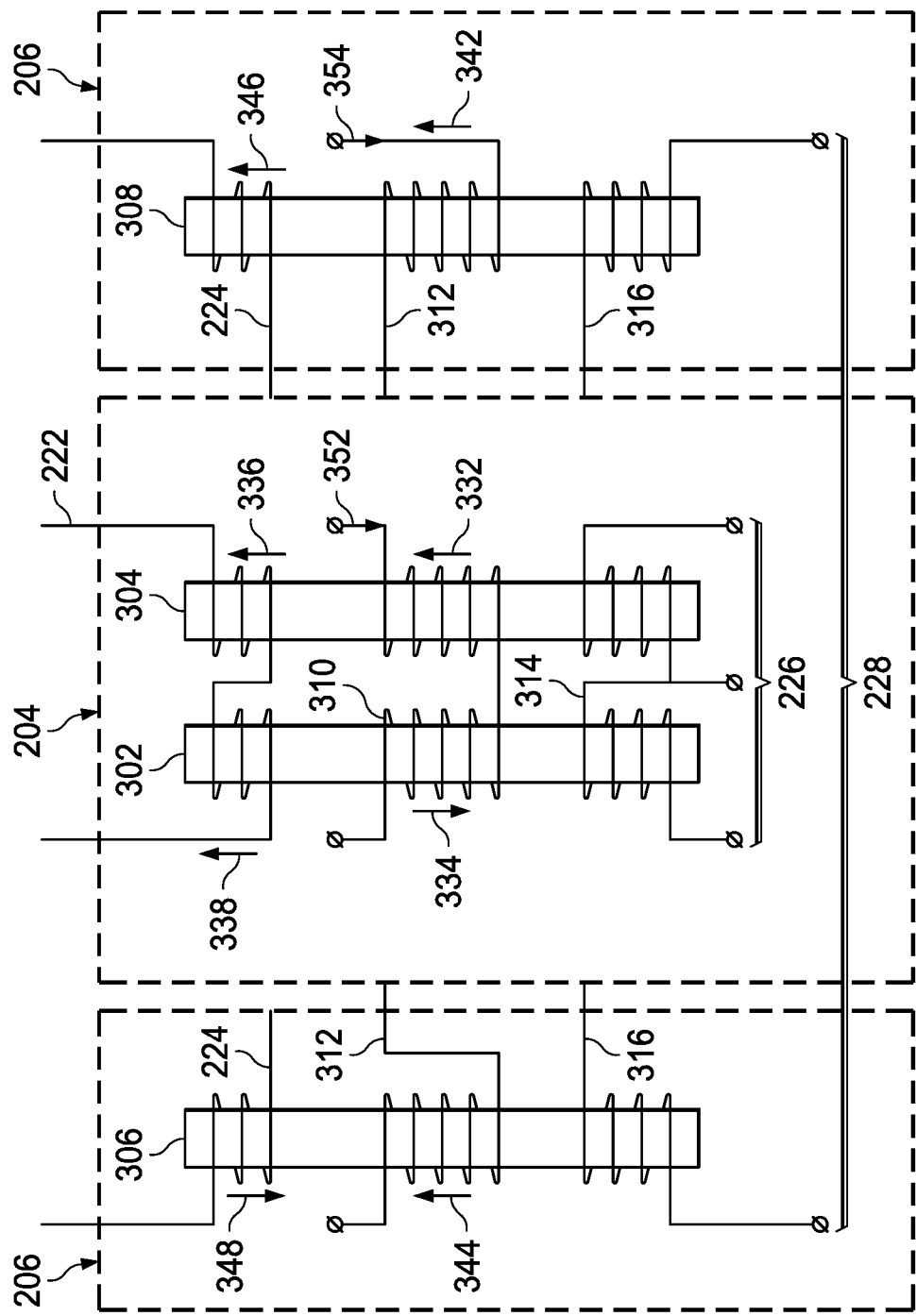
FIG. 3 shows an illustrative block diagram of a common mode sensitive magnetometer and a differential mode sensitive magnetometer included in an integrated fluxgate magnetic gradient sensor in accordance with various embodiments.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection, or through an indirect connection via other devices and connections. The recitation "based on" is intended to mean "based at least in part on." Therefore, if X is based on Y, X may be based on Y and any number of other factors.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

In many systems, a magnetic field gradient is measured. For example, a magnetic field gradient may be utilized to determine the amount of current flowing through a bus bar. In conventional systems, two separate magnetic sensors (e.g., fluxgate sensors) are utilized to measure the magnetic field gradient. For example, one sensor may be placed at one location within the magnetic field while the second sensor may be placed at a second location within the magnetic field. The output of the second sensor then may be subtracted from the output of the first sensor. This requires a precision subtraction of the sensor output signals. Thus, separate logic and/or additional analog components outside of the sensors is required to compute the subtraction and a relatively large offset is created. Additionally, as the magnetic field gets larger, more current is required to compensate the fluxgate sensors. Thus, more power is required in the system.

In some conventional systems, driver circuits are utilized to compensate the fluxgate sensors. This compensation current, due to a feedback loop with the fluxgate sensor, corresponds with the magnetic field at the location of the sensor and is typically sensed utilizing a shunt resistor. Because the conventional system requires two fluxgate sensors, two driver circuits are required to provide the compensation current to the two fluxgate sensors, and two matched shunt resistors are required to sense the compensation current. Therefore, a conventional system requires matched shunt resistors as well as matched instrumentation amplifiers to read the voltage across the shunt resistors. This is difficult to implement and requires excessive chip area and power use. Therefore, it is desirable to design a system that utilizes a single integrated magnetic gradient sensor and a driver circuit that does not require matched shunt resistors and matched amplifiers to drive the sensor.

In accordance with the disclosed principles, a single integrated fluxgate magnetic gradient sensor is disclosed. To compensate for common mode magnetic fields, the integrated fluxgate magnetic gradient sensor may include a common mode sensitive fluxgate magnetometer surrounded by a differential mode sensitive fluxgate magnetometer. In the magnetic domain, common mode fields are magnetic fields in the same direction while differential mode fields are magnetic fields in opposite directions. The common mode sensitive fluxgate magnetometer may include two cores adjacent to one another, each wrapped by three wires, a compensation wire, an excitation wire, and a sense wire. The differential mode sensitive fluxgate magnetometer may also include two cores, one adjacent to one of the cores of the common mode sensitive fluxgate magnetometer and the second core adjacent to the second core of the common mode sensitive fluxgate magnetometer. Similar to the cores of the common mode sensitive fluxgate magnetometer, each of the cores of the differential mode sensitive fluxgate magnetometer is wrapped by three wires, a compensation wire, an excitation wire, and a sense wire. However, the differential mode sensitive fluxgate magnetometer cores are wrapped by the wires such that the differential mode sensitive fluxgate magnetometer is sensitive to the difference in the density of the magnetic field at the location of the two cores (i.e., sensitive to magnetic fields in opposite directions in the two cores) while the common mode sensitive fluxgate magnetometer cores are wrapped by the wires such that it is sensitive to common mode fields at the location of the two cores (i.e., sensitive to magnetic fields in the same direction in the two cores).

The driver circuit is configured to compensate the cores of both magnetometers with a differential voltage and/or a differential mode drive current generated by a differential voltage driver. The sensed voltage of the common mode sensitive fluxgate magnetometer is then fed back to the driver circuit to drive the differential mode drive current. Thus, the differential mode sensitive fluxgate magnetometer is compensated for common mode magnetic fields. Additionally, the driver circuit is configured to compensate the cores of the differential mode sensitive magnetometer with a single-ended voltage and/or drive current generated by a single-ended voltage driver. The sensed voltage of the differential mode sensitive fluxgate magnetometer is then fed back to the driver circuit to drive the single-ended drive current. Once the sensed voltage of the differential mode sensitive fluxgate magnetometer is zero, the compensation current of the differential mode sensitive magnetometer, as driven by the driver circuit, corresponds to the gradient of the magnetic field and may be measured as a voltage across a single shunt resistor.

FIG. 1 shows an illustrative block diagram of a current measurement system 100 utilizing an integrated fluxgate magnetic gradient sensor 104 in accordance with various embodiments. The current measurement system 100 may include a bus bar 102 and the integrated fluxgate magnetic sensor 104. Bus bar 102 may be a metallic bar or strip (e.g., aluminum, brass, and/or copper), that may have a cross-sectional area that is greater than a wire, and is configured to conduct current. In some embodiments, bus bar 102 may be utilized within a battery bank, a distribution board, a substation, a switchboard, and/or any other electrical apparatus and/or system.

In some examples, bus bar 102 includes a hole of any shape (e.g., circular), through the bus bar 102. Thus, as current 122 flows through bus bar 102, which may be hundreds of Amperes in magnitude, a magnetic field 124 is generated around the hole. More particularly, magnetic field 124 may be generated as two field components, one around one half of the bus bar 102 (one half of the bus bar 102 separated by the hole) and the other around the other half of the bus bar 102. Additionally, one or more background magnetic fields 126 (e.g., magnetic field generated by Earth) may surround the bus bar 102. The integrated fluxgate magnetic sensor 104 may be positioned within the hole in the bus bar 102 as a single integrated circuit. The integrated fluxgate magnetic sensor 104 may be configured to measure the gradient of the magnetic field 124. In other words, integrated fluxgate magnetic sensor 104 may be configured to determine the difference in magnitude of the density of magnetic field 124 in two separate locations. For example, integrated fluxgate magnetic sensor 104 may be configured to determine the magnitude of the magnetic field 124 in one location within the hole and a separate location within the hole in bus bar 102. More particularly, integrated fluxgate magnetic sensor 104 may be configured to determine the total magnetic field (i.e., magnetic fields 124 and 126) in the two locations. Because the background fields 126 are equal in both locations in the hole, the integrated fluxgate magnetic sensor 104 may measure the gradient of the magnetic field 124 by determining the difference in the total magnetic field in the two locations.

The magnitude of the gradient of the magnetic field 124 then may be utilized to calculate and/or measure the magnitude of current 122. In some embodiments, a processing device within the integrated fluxgate magnetic sensor 104 may utilize the gradient of the magnetic field 124 to calculate the current 122, while in other embodiments, integrated fluxgate magnetic sensor 104 may sense the gradient of the magnetic field 124 and transmit the gradient information to other devices for processing.

While the current measurement system 100 shown in FIG. 1 is configured to measure current 122 through bus bar 102 utilizing integrated fluxgate magnetic sensor 104, in alternative embodiments, current through any other device may be determined by utilizing the gradient in a magnetic field measured by integrated fluxgate magnetic sensor 104. Furthermore, as discussed above, a current need not be determined by integrated fluxgate magnetic sensor 104. Instead, the integrated fluxgate magnetic sensor 104 may be configured to sense the gradient in any magnetic field, including magnetic fields that are not located around bus bars, but in any location.

FIG. 2 shows an illustrative block diagram of integrated fluxgate magnetic gradient sensor 104 in accordance with various embodiments. The integrated fluxgate magnetic sensor 104 may include a driver circuit 202, a common mode sensitive magnetometer 204, a differential mode sensitive magnetometer 206, and a processing device 208. In some embodiments, the components of the integrated fluxgate magnetic gradient sensor 104 (i.e., driver circuit 202, a common mode sensitive magnetometer 204, a differential mode sensitive magnetometer 206, and a processing device 208) may be integrated on the same integrated circuit substrate and/or disposed in a common package. Driver circuit 202 may be configured to drive voltage and/or current to common mode sensitive magnetometer 204 (i.e., drive a differential mode drive current generated by a differential voltage driver to common mode sensitive magnetometer 204) and differential mode sensitive magnetometer 206 (i.e., drive a single-ended drive current generated by a single-ended voltage driver to differential mode sensitive magnetometer 204). In some embodiments driver circuit 202 drives the common mode sensitive magnetometer 204 through wire 222 and the differential mode sensitive magnetometer through the wire 224. Additionally, the driver circuit 202 may be coupled to common mode sensitive magnetometer 204 in a closed loop system, such that a sense voltage 226 from the common mode sensitive magnetometer 204 may be utilized as an input into the driver circuit 202. Similarly, the driver circuit 202 may be coupled to differential mode sensitive magnetometer 206 in a closed loop system, such that a sense voltage 228 from the differential mode sensitive magnetometer 206 may be utilized as an input into the driver circuit 202.

Common mode sensitive magnetometer 204 may be a fluxgate magnetometer that is configured such that it receives an excitation current that generates a differential magnetic field and thus, is capable of sensing common mode magnetic fields as common mode sense voltage 226. Differential mode sensitive magnetometer 206 may be a fluxgate magnetometer that is configured such that it receives an excitation current that generates a common mode magnetic field and thus, is capable of sensing differential mode magnetic fields as differential mode sense voltage 228.

In some embodiments, integrated fluxgate magnetic sensor 104 includes processing device 208. In alternative embodiments, integrated fluxgate magnetic sensor 104 does not include processing device 208. Processing device 208 may be any type of electrical processing device, such as a microprocessor and/or a microcontroller or other electrical processing device, and may include a processor core, memory, and programmable input/output peripherals. The memory may be in the form of flash, read-only memory, random access memory, or any other type of memory or combination of types of memory. The components of the processing device 208 may be implemented as a system on a chip (SoC) on a single integrated circuit with the other components of integrated fluxgate magnetic sensor 104. In alternative embodiments, the processing device 208 may be implemented across multiple integrated circuits.

FIG. 3 shows an illustrative block diagram of common mode sensitive magnetometer 204 and differential mode sensitive magnetometer 206 included in an integrated fluxgate magnetic gradient sensor 104 in accordance with various embodiments. Common mode sensitive magnetometer 204 may include two magnetic cores (sometimes called bars) 302 and 304 adjacent to one another. In some embodiments, cores 302-304 are comprised of a ferromagnetic material (e.g., a nickel-iron soft magnetic alloy with high permeability). An excitation wire coil 310 (sometimes called a primary coil) may be wound around cores 302-304. An excitation current 352 then may be driven through excitation wire coil 310 by an excitation circuit (not shown). The excitation current may be an alternating current that causes the cores 302-304 to enter into a cycle of magnetic saturation and unsaturation. When in an unsaturated state, cores 302-304 are highly permeable (i.e., there is a strong linkage between the coils of excitation wire coil 310). However, when in a saturated state, cores 302-304 are weakly permeable (i.e., there is no or a weak linkage between the coils of excitation wire coil 310). The point at which the cores 302-304 saturate depends on the combined magnetic field 124-126 at the location of the common mode sensitive magnetometer 204.

The excitation coil wire 310 is configured and/or wound around cores 302-304 such that the excitation current 352 generates opposite excitation magnetic fields 332-334 in the in the cores 302-304. In the presence of an external magnetic field (e.g., magnetic field 124 and/or 126), one of cores 302-304 may saturate sooner than the other of cores 302-304. This may induce a signal in a sense wire coil 314 that has a relationship to the combined magnetic field 124-126. The sense wire coil 314 may be configured and/or wound around cores 302-304 such that the voltage induced in the sense wire coil 314 is proportional to the sum of the field change in cores 302-304. In other words, the excitation magnetic fields 332-334 are differential mode such that they cancel each other out in a common mode sense. Thus, the common mode sense voltage 226 is the voltage across the sense coil wire 314.

The common mode sense voltage 226 may be provided as an input to the driver circuit 202 to drive a current through common mode compensation wire coil 222. Common mode compensation wire coil 222 is configured and/or wrapped around cores 302-304, in some embodiments in the same direction as the sense coil wire 314 is wrapped around cores 302-304, creating compensation magnetic fields 336-338 in cores 302-304. Compensation magnetic fields 336-338 are common mode fields (i.e., in the same direction in both cores 302-304) and, in some embodiments, equal in magnitude. This provides compensation (i.e., corrects) for any external magnetic fields (e.g., fields 124-126). Through the feedback loop, the driver circuit 202 is configured to drive current through compensation wire coil 222 until the common mode sense voltage 226 is zero. The amount of current required to drive the common mode sense voltage 226 to zero corresponds to the magnitude of the combined magnetic fields 124-126.

Differential mode sensitive magnetometer 206 may include two magnetic cores 306-308. In some embodiments, core 306 is adjacent to core 302 and core 308 is adjacent to core 304. Thus, in some embodiments, the cores 306-308 are separated by the common mode sensitive magnetometer 206. In some embodiments, cores 306-308 are comprised of a ferromagnetic material (e.g., a nickel-iron soft magnetic alloy with high permeability). Furthermore, the cores 302-308 may all be approximately the same thickness. An excitation wire coil 312 may be wound around cores 306-308. An excitation current 354 then may be driven through excitation wire coil 312 by an excitation circuit (not shown). The excitation current 354 may be an alternating current that causes the cores 306-308 to enter into a cycle of magnetic saturation and unsaturation. When in an unsaturated state, cores 306-308 are highly permeable (i.e., there is a strong linkage between the coils of excitation wire coil 312). However, when in a saturated state, cores 306-308 are weakly permeable (i.e., there is no or a weak linkage between the coils of excitation wire coil 312). The point at which the cores 306-308 saturate depends on the combined magnetic field 124-126 at the respective locations of the cores 306-308.

The excitation coil wire 312 is configured and/or wound around cores 306-308 such that the excitation current 354 generates excitation magnetic fields 342-344 in the cores 306-308 in the same direction (i.e., common mode). In the presence of an external magnetic field (e.g., magnetic field 124 and/or 126), one of cores 306-308 may saturate sooner than the other of cores 306-308. This may induce a signal in a sense wire coil 316 that has a relationship to the difference in the combined magnetic field 124-126 at the location of core 306 and the combined magnetic field 124-126 at the location of core 308. The sense wire coil 316 may be configured and/or wound around cores 306-308 such that the voltage induced in the sense wire coil 314 is proportional to the difference of the field change in cores 306-308. In other words, the excitation magnetic fields 342-344 are common mode such that the sense coil wire 316 is sensitive to a differential field. Thus, the differential mode sense voltage 228 is the voltage across the sense coil wire 316 and it corresponds with the gradient of the magnetic field 124.

The differential mode sense voltage 228 may be provided as an input to the driver circuit 202 to drive a current through differential mode compensation wire coil 224. In some embodiments, differential mode compensation wire coil 224 is configured to have the same resistance as common mode compensation wire coil 222. Differential mode compensation wire coil 224 is configured and/or wrapped around cores 306-308, in some embodiments in the same direction as the sense coil wire 316 is wrapped around cores 306-308, creating compensation magnetic fields 346-348 in cores 306-308. Differential magnetic fields 346-348 are differential mode fields (i.e., the magnetic field in core 306 is opposite in direction as the magnetic field in core 308) and, in some embodiments, equal in magnitude. Through the feedback loop, the driver circuit 202 is configured to drive current through compensation wire coil 224 until the differential mode sense voltage 228 is zero. The amount of current required to drive the differential mode sense voltage 228 to zero corresponds to the magnitude of the gradient of the combined magnetic fields 124-126, and thus corresponds with the magnitude of the gradient of magnetic field 124.

FIG. 4 shows an illustrative block diagram of driver circuit 202 included in integrated fluxgate magnetic gradient sensor 104 in accordance with various embodiments. The driver circuit 202 may include a differential voltage driver 402, a single-ended voltage driver 404, and a shunt resistor 406. Differential voltage driver 402 may be an amplifier configured to drive a differential voltage and/or a differential mode compensation current, via common mode compensation wire coil 222, through common mode sensitive fluxgate magnetometer 204. Additionally, to compensate for the common mode magnetic field, differential voltage driver 402 may be configured to drive the differential voltage and/or differential mode compensation current, via differential mode compensation wire coil 224, through the differential mode sensitive fluxgate magnetometer 206. Thus, the differential voltage driver 402 may be coupled to the common mode sensitive fluxgate magnetometer 204 and the differential mode sensitive fluxgate magnetometer 206 in parallel at terminals 422-424. The difference in current at from terminal 422 to 424 may be the differential mode compensation current. Furthermore, as discussed previously, the common mode sense voltage 226 may be utilized as an input to the differential voltage driver 402. Thus, differential voltage driver 402 may be configured to compensate for the common mode magnetic field by generating a differential voltage (in the electrical domain).

The single-ended voltage driver 404 may be coupled, through its output, to shunt resistor 406 and the differential mode sensitive fluxgate magnetometer 206. The single-ended voltage driver 404 may be an amplifier configured to drive a single-ended voltage and/or a compensation current, via differential mode compensation wire coil 224, through differential mode sensitive fluxgate magnetometer 206. Furthermore, as discussed previously, the differential mode sense voltage 228 may be utilized as an input to the differential mode driver 404. As discussed previously, the single-ended voltage (i.e., the output of single-ended voltage driver 404) corresponds with the gradient of the magnetic field 124 due to the nature of the integrated fluxgate magnetic gradient sensor 104 and the feedback loop with the driver circuit 202, and more particularly differential mode driver 404. In other words, single-ended voltage driver 404 may be configured to compensate for the differential magnetic field by generating a single-ended voltage which creates a current in coil wire 224 that is common mode (i.e., the same direction in cores 306-308) and equal in magnitude.

Thus, the voltage across shunt resistor 406, labelled as magnetic field gradient voltage 408, and/or the current through shunt resistor 406 corresponds with the magnetic field 124. Therefore, the magnetic field gradient voltage 408 may be sensed and provided to a processing device, such as processing device 208 for further processing. In this manner, a single sensor (i.e., integrated fluxgate magnetic gradient sensor 104) may determine the gradient of a magnetic field compensating for the presence of a common mode field.

Figure 5:
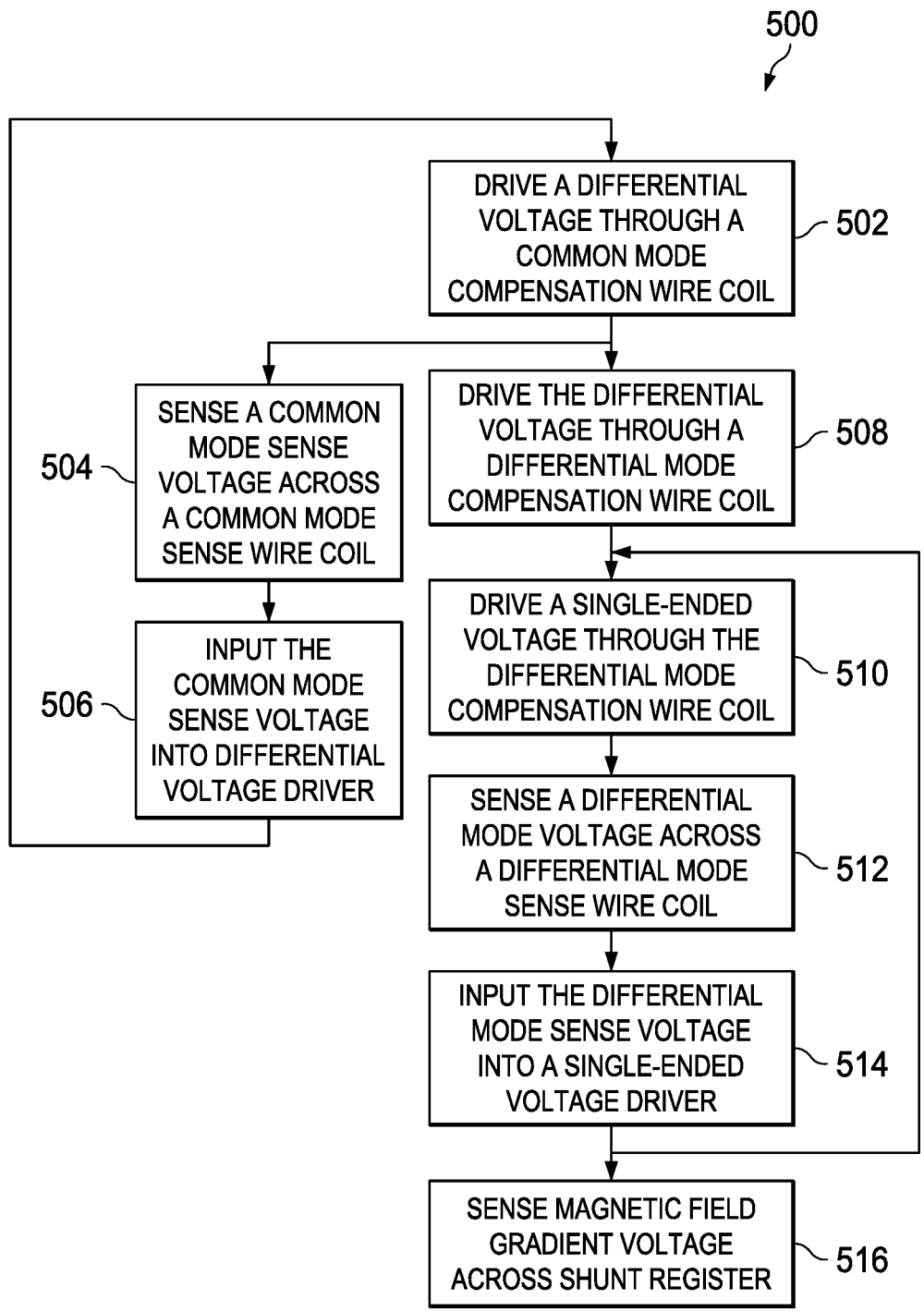
FIG. 5 shows an illustrative flow diagram of a method for measuring a magnetic field gradient in accordance with various embodiments.

FIG. 5 shows an illustrative flow diagram of a method 500 for measuring a magnetic field gradient in accordance with various embodiments. Though depicted sequentially as a matter of convenience, at least some of the actions shown can be performed in a different order and/or performed in parallel. Additionally, some embodiments may perform only some of the actions shown. In some embodiments, at least some of the operations of the method 500, as well as other operations described herein, can be performed by integrated fluxgate magnetic gradient sensor 104 including driver circuit 202, common mode sensitive magnetometer 204, and/or differential mode sensitive magnetometer 206 and implemented by a processor executing instructions stored in a non-transitory computer readable storage medium.

The method 500 begins in block 502 with driving a differential voltage and/or a differential mode compensation current through a common mode compensation wire coil. For example, a differential voltage and/or differential mode compensation current may be driven by differential voltage driver 402 through common mode compensation wire coil 222 which may be wrapped around cores 302-304. The method 500 continues in block 504 and 508. In block 504, the method 500 continues with sensing a common mode voltage across a common mode sense wire coil. For example, common mode sense voltage 226 may be sensed across the common mode sense wire coil 314. The differential voltage through common mode compensation wire coil 222 affects the magnetic fields 336-338 and the common mode sense voltage 226. The method 500 continues in block 506 with inputting the common mode sense voltage into the differential voltage driver. For example, the common mode sense voltage 226 may be input into an amplifier that comprises the differential voltage driver 402. This type of feedback loop enables the differential voltage driver 402, with a sufficient drive voltage and/or current, to drive the common mode sense voltage 226 to zero.

In block 508, the method 500 continues with driving the differential voltage through a differential mode compensation wire coil. For example, the differential voltage may be driven by differential voltage driver 402 through differential mode compensation wire coil 224 which may be wrapped around cores 306-308. The method 500 continues in block 510 with driving a single-ended voltage and/or compensation current through the differential mode compensation wire coil. For example, a single-ended voltage may be driven by single-ended voltage driver 404 through the differential mode compensation wire coil 224. In block 512, the method 500 continues with sensing a differential mode voltage across a differential mode sense wire coil. For example, differential mode sense voltage 228 may be sensed across the differential mode sense wire coil 316. The single-ended voltage and/or compensation current through differential mode compensation wire coil 224 affects the magnetic fields 346-348 and the differential mode sense voltage 228. The method 500 continues in block 514 with inputting the differential mode sense voltage into the single-ended voltage driver. For example, the differential mode sense voltage 228 may be input into an amplifier that comprises the single-ended voltage driver 404. The method 500 continues in blocks 510 and block 516. In block 510, the method 500 continues with again driving a single-ended voltage and/or compensation current through the differential mode compensation wire coil. This type of feedback loop enables the single-ended voltage driver 404, with a sufficient drive current, to drive the differential mode sense voltage 228 to zero. In block 516, the method continues with sensing the magnetic field gradient voltage across a shunt resistor. For example, the voltage across shunt resistor 406 may be sensed. Once the differential mode sense voltage is driven to zero, the single-ended voltage and/or the compensation current corresponds with the magnetic field gradient voltage 408.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

The invention claimed is:

1. An integrated fluxgate magnetic gradient sensor, comprising:
a common mode sensitive fluxgate magnetometer including a first core adjacent to a second core, the first and second cores wrapped by a first excitation wire coil configured to receive a first excitation current that affects a differential mode magnetic field;
a differential mode sensitive fluxgate magnetometer including a third core adjacent to the first core and a fourth core adjacent to the second core, the third and fourth cores wrapped by a second excitation wire coil configured to receive a second excitation current that affects a common mode magnetic field; and
a differential voltage driver coupled to the common mode sensitive fluxgate magnetometer and the differential mode sensitive fluxgate magnetometer and configured to drive a first compensation current through a first compensation wire coil wrapped around the first core and the second core and a second compensation wire coil wrapped around the third core and the fourth core.

2. The integrated fluxgate magnetic gradient sensor of claim 1, wherein the common mode sensitive fluxgate magnetometer further includes a common mode sense wire coil configured to output a voltage proportional to a common mode magnetic field.

3. The integrated fluxgate magnetic gradient sensor of claim 2, wherein the voltage across the common mode sense wire coil corresponds to a sum of field change in the first and second cores of the common mode sensitive fluxgate magnetometer.

4. The integrated fluxgate magnetic gradient sensor of claim 1, wherein the differential mode sensitive fluxgate magnetometer further includes a differential mode sense wire coil configured to output a voltage proportional to a differential mode magnetic field.

5. The integrated fluxgate magnetic gradient sensor of claim 4, wherein the voltage across the differential mode sense wire coil corresponds to a difference in field changes in the third and fourth cores of the differential mode sensitive fluxgate magnetometer.

6. The integrated fluxgate magnetic gradient sensor of claim 1, further comprising a single-ended voltage driver coupled to the differential mode sensitive fluxgate magnetometer and configured to drive a second compensation current through the second compensation wire coil.

7. The integrated fluxgate magnetic gradient sensor of claim 6, wherein the common mode sensitive fluxgate magnetometer further includes a common mode sense wire coil and an input to the differential voltage driver is a voltage across the common mode sense wire coil.

8. The integrated fluxgate magnetic gradient sensor of claim 6, wherein the differential mode sensitive fluxgate magnetometer further includes a differential mode sense wire coil and an input to the single-ended voltage driver is a voltage across the differential mode sense wire coil.

* * * * *